(12) United States Patent
Liao et al.

(10) Patent No.: US 7,273,663 B2
(45) Date of Patent: *Sep. 25, 2007

(54) WHITE OLED HAVING MULTIPLE WHITE ELECTROLUMINESCENCE UNITS

(75) Inventors: Liang-Sheng Liao, Rochester, NY (US); Tukaram K. Hatwar, Penfield, NY (US); Kevin P. Klubek, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 344 days.

This patent is subject to a terminal disclaimer.

(21) Appl. No.: 10/922,606

(22) Filed: Aug. 20, 2004

(65) Prior Publication Data

US 2006/0040132 A1  Feb. 23, 2006

(51) Int. Cl.
*H01L 51/50* (2006.01)
(52) U.S. Cl. ............... 428/690; 428/917; 428/212; 313/504; 313/506; 257/88; 257/96
(58) Field of Classification Search ........... 428/690, 428/917, 212; 313/504, 506; 257/88, 96
See application file for complete search history.

(56) References Cited

U.S. PATENT DOCUMENTS 4,769,292 A  9/1988  Tang et al.
4,885,211 A  12/1989  Tang et al.

(Continued)

FOREIGN PATENT DOCUMENTS

EP  1 339 112  8/2003

(Continued)

OTHER PUBLICATIONS

Kido et al. in "White light-emitting organic electroluminescent devices using the poly(N-vinylcarbazole) emitter layer doped with three fluorescent dyes", Applied *Physics Letters*, 64, 815-817, (1994).

(Continued)

*Primary Examiner*—Dawn L. Garrett
(74) *Attorney, Agent, or Firm*—Raymond L. Owens

(57) ABSTRACT

A tandem white OLED device includes an anode, a cathode, and a plurality of organic electroluminescence units disposed between the anode and the cathode, wherein each organic electroluminescence unit includes at least one light-emitting layer, and wherein each organic electroluminescence unit emits white light. The device also includes an intermediate connector disposed between each adjacent organic electroluminescence unit, wherein the intermediate connector includes at least two different layers, and wherein the intermediate connector has no direct connection to an external power source.

81 Claims, 9 Drawing Sheets

U.S. PATENT DOCUMENTS

| | | | |
|---|---|---|---|
| 5,683,823 | A | 11/1997 | Shi et al. |
| 6,107,734 | A | 8/2000 | Tanaka et al. |
| 6,337,492 | B1 | 1/2002 | Jones et al. |
| 6,717,358 | B1 | 4/2004 | Liao et al. |
| 2003/0170491 | A1 | 9/2003 | Liao et al. |
| 2003/0189401 | A1 | 10/2003 | Kido et al. |
| 2007/0046189 | A1* | 3/2007 | Hatwar et al. ............ 313/506 |

FOREIGN PATENT DOCUMENTS

| | | |
|---|---|---|
| EP | 1 351 558 | 10/2003 |
| JP | 07-142169 | 6/1995 |
| JP | 2003045676 A | 2/2003 |
| WO | WO 2005/115059 | 12/2005 |

OTHER PUBLICATIONS

Deshpande et al., "White-light-emitting organic electroluminescent devices based on interlayer sequential energy transfer", *Applied Physics Letters*, 75, (1999), 888-890.

Tokito et al. in "High-efficiency white phosphorescent organic light-emitting devices with greenish-blue and red-emitting layers", *Applied Physics Letters*, 83, (2003), 2459-2461.

Matsumoto et al., "Multiphoton Organic EL Devices having Charge Generation Layers", SID 03 Digest, (2003), 979-981.

Liao et al., "High-efficiency tandem organic light-emitting diodes", Applied Physics Letters, 84, 167-169, (2004).

* cited by examiner

WHITE OLED HAVING MULTIPLE WHITE ELECTROLUMINESCENCE UNITS

CROSS REFERENCE TO RELATED APPLICATIONS

Reference is made to commonly assigned U.S. patent application Ser. No. 10/437,195 filed May 13, 2003, now U.S. Pat. No. 6,936,961 issued on Aug. 30, 2005 by Liao et al., entitled "Cascaded Organic Electroluminescent Device Having Connecting Units with n-Type and p-Type Organic Layers"; U.S. patent application Ser. No. 10/857,516 filed May 28, 2004, now U.S. Pat. No. 7,126,267 issued on Oct. 24, 2006 by Liang-Sheng Liao et al., entitled "Tandem OLED Having Stable Intermediate Connectors"; U.S. patent application Ser. No. 10/607,325 filed Jun. 26, 2003, now U.S. Pat. No. 6,903,378 filed Jun. 7, 2005 by Ronald Steven Cok, entitled "Stacked OLED Display Having Improved Efficiency"; and pending U.S. patent application Ser. No. 10/882,834 filed Jul. 1, 2004 by Tukaram K. Hatwar et al., entitled "High Performance White Light-Emitting OLED Device", the disclosures of which are herein incorporated by reference.

FIELD OF INVENTION

The present invention relates to providing a plurality of white organic electroluminescence (EL) units to form a tandem white organic electroluminescent device.

BACKGROUND OF THE INVENTION

An organic light-emitting diode device, also called an OLED device, commonly includes a substrate, an anode, a hole-transporting layer (HTL), light-emitting layer (LEL), an electron-transporting layer (ETL), and a cathode. OLED devices are attractive because of their low drive voltage, high luminance, wide viewing angle, and capability for full color flat emission displays and for other applications. Tang et al. describe this multilayer OLED device in their U.S. Pat. Nos. 4,769,292 and 4,885,211.

An OLED device can emit different colors, such as red, green, blue, or white, depending on the emitting property of its LEL. There is a great demand for white-light OLED (or white OLED) devices where there is substantial emission in the red, green, and blue portions of the spectrum and generally have 1931 Commission Internationale d'Eclairage (CIE) chromaticity coordinates, (CIEx, CIEy), of about (0.33, 0.33). White OLED devices can be used for solid-state lighting sources and for full color displays. As a solid-state lighting source, a white OLED device generally needs a capability to have very bright emission. As an emitting pixel in a full color display array, a white OLED device also needs a high brightness because the final color as perceived by the viewer is dictated by a corresponding color filter element which reduces the initial emission intensity by about two third (⅔). In order to achieve the same viewing brightness as that of a full color display using red, green, and blue OLEDs as emitting elements, the white OLED has to be driven under higher current density. However, an OLED device will rapidly degrade when driven at high current density. Although white OLED devices have already achieved high brightness as reported by J. Shi et al. in U.S. Pat. No. 5,683,823, Sato et al. in JP 07-142169, Kido et al. in "White light-emitting organic electroluminescent devices using the poly(N-vinylcarbazole) emitter layer doped with three fluorescent dyes", Applied *Physics Letters,* 64, 815 (1994), Deshpande et al. in "White light-emitting organic electroluminescent devices based on interlayer sequential energy transfer", *Applied Physics Letters,* 75, 888 (1999), and Tokito et al. in "High-efficiency white phosphorescent organic light-emitting devices with greenish-blue and red-emitting layers", *Applied Physics Letters,* 83, 2459 (2003), further improvement is still needed.

Recently, a new kind of OLED structure called tandem OLED (or stacked OLED, or cascaded OLED), which is fabricated by stacking several individual OLEDs vertically and driven by a single power source, has also been proposed or fabricated by Jones et al. in U.S. Pat. No. 6,337,492, Tanaka et al. in U.S. Pat. No. 6,107,734, Kido et al. in JP Patent Publication 2003045676A and in U.S. Patent Publication 2003/0189401 A1, and Liao et al. in U.S. Pat. No. 6,717,358 and U.S. Patent Application Publication 2003/0170491 A1. For example, Tanaka et al., U.S. Pat. No. 6,107,734, demonstrate a 3-EL-unit tandem OLED using In—Zn—O (IZO) films or Mg:Ag/IZO films as intermediate connectors and achieved a luminous efficiency of 10.1 cd/A from pure tris(8-hydroxyquinoline)aluminum emitting layers. Matsumoto et al., "Multiphoton Organic EL Device having Charge Generation Layer", *SID* 03 *Digest,* 979 (2003), fabricate 3-EL-unit tandem OLEDs using In—Sn—O (ITO) films or $V_2O_5$ films as intermediate connectors and achieved a luminous efficiency of up to 48 cd/A from fluorescent dye doped emitting layers. Liao et al., "High-efficiency tandem organic light-emitting diodes", *Applied Physics Letters,* 84, 167 (2004), demonstrate a 3-EL-unit tandem OLED using doped organic "p-n" junction layers as intermediate connectors and achieved a luminous efficiency of 136 cd/A from phosphorescent dye doped emitting layers.

The performance of white OLED devices can be improved by using the aforementioned tandem OLED device structures. For example, Matsumoto et al., in FIG. 8 of "Multiphoton Organic EL Device having Charge Generation Layer", *SID* 03 *Digest,* 979 (2003), demonstrate that a tandem white OLED device can be constructed by connecting a greenish blue EL unit and an orange EL unit in the device, and white light emission can be achieved by driving this device with a single power source. Liao et al. in FIG. 7 of U.S. Patent Application Publication 2003/0170491 A1 propose to construct a tandem white OLED by connecting a red EL unit, a green EL unit, and a blue EL unit in series in the device. When the tandem white OLED is driven by a single power source, white light emission can be formed by spectral combination from the red, green, and blue EL units.

However, the prior art has only taught how to construct a tandem white OLED device using multiple EL units, each unit having a different primary color emission, i.e., having a red, green, or a blue color emission from each of the EL units. With this configuration, the white color will be changing with time because each EL unit has different degradation behavior during operation. Moreover, device fabrication will be more complicated and more time consuming because each EL unit has a different layer structure.

SUMMARY OF THE INVENTION

In the present invention, tandem white OLED devices are constructed using a plurality of white EL units and drive the devices only using a single power source.

It is an object of the present invention to make white OLED devices with high luminance efficiency and high brightness.

It is another object of the present invention to make tandem white OLED devices with improved lifetime.

It is yet another object of the present invention to make tandem white OLED devices with improved color stability.

It is a further object of the present invention to make tandem white OLED devices with relatively simple fabrication steps.

These objects are achieved by a tandem white OLED device comprising:
 a) an anode;
 b) a cathode;
 c) a plurality of organic electroluminescence units disposed between the anode and the cathode, wherein each organic electroluminescence unit includes at least one light-emitting layer, and wherein each organic electroluminescence unit emits white light; and
 d) an intermediate connector disposed between each adjacent organic electroluminescence unit, wherein the intermediate connector includes at least two different layers, and wherein the intermediate connector has no direct connection to an external power source.

ADVANTAGEOUS EFFECT OF THE INVENTION

An advantage of the present invention is that the white OLED device made with the tandem structure can have high luminous efficiency and high brightness. As a result, the device has longer lifetime when driving it under lower current density while keeping the same required brightness.

Another advantage of the present invention is that color stability is improved.

Yet another advantage of the present invention is that device fabrication is simplified.

It will be understood that FIGS. 1-16 are not to scale since the individual layers are too thin and the thickness differences of various layers too great to permit depiction to scale.

DETAILED DESCRIPTION OF THE INVENTION

Several terms to be used in the following description are explained herein. The term "full color" is employed to describe the emission color in the red, green, and blue regions of the visible spectrum. The red, green, and blue colors constitute the three primary colors from which other colors can be produced by appropriate mixing. The term "white color" is employed to describe the mixing color from the red, green, and blue portions of the visible spectrum, wherein the white color has the Commission Internationale de l'Eclairage (CIE) coordinates of about CIEx=0.33 and CIEy=0.33. "White light" is the light that is perceived by a user as having a white color, or the light that has an emission spectrum sufficient to be used in combination with color filters to reproduce the red, green, and blue colors for full color display applications. (Although the CIEx, CIEy coordinates of about 0.33, 0.33 can be ideal under some circumstances, the actual coordinates can vary significantly and are still very useful). The term "pixel" is employed in its art recognized usage to designate an area of a display panel that can be stimulated to emit light independently. The term "n-type doped organic layer" means that the organic layer has semiconducting properties after doping, and the electrical current through this layer is substantially carried by the electrons. The term "p-type doped organic layer" means that the organic layer has semiconducting properties after doping, and the electrical current through this layer is substantially carried by the holes. A "high work function metal" is defined as a metal having a work function no less than 4.0 eV. Likewise, a "low work function metal" is defined as a metal having a work function less than 4.0 eV.

In order to appreciate the construction and the performance of the tandem white OLED device comprising a plurality of white EL units in the present invention, the prior art tandem white OLED devices will be described with reference to FIGS. 1 and 2.

Figure 1:
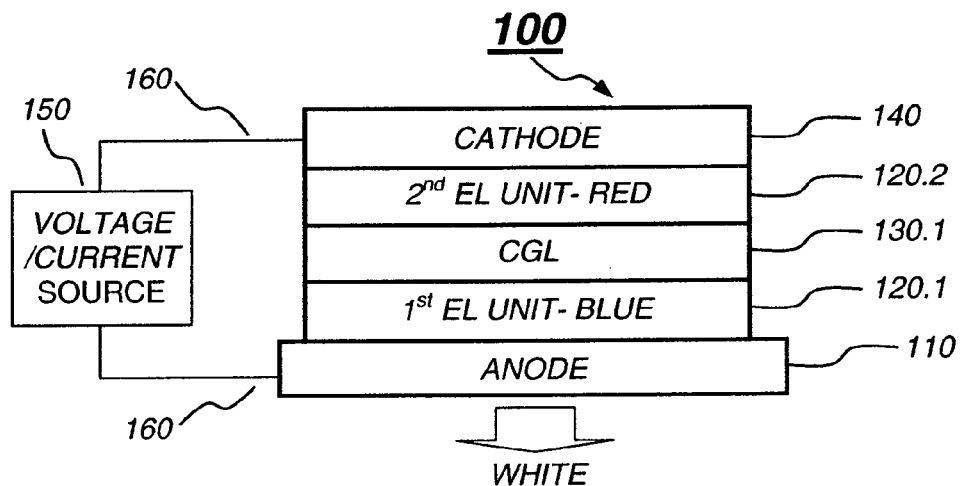
FIG. 1 depicts a schematic cross sectional view of a prior art tandem white OLED device having two EL units with different colors of emission.

FIG. 1 shows a prior art tandem white OLED device 100. This tandem white OLED device has an anode 110 and a cathode 140. Disposed between the anode and the cathode are one blue EL unit 120.1 ($1^{st}$ EL unit—blue) and one red EL unit 120.2 ($2^{nd}$ EL unit—red). These two organic EL units are stacked and connected serially to each other with a layer named as charge-generating layer 130.1 (CGL), such as $V_2O_5$ or indium-tin-oxide, as an intermediate connector. When the tandem white OLED device 100 is externally connected to a voltage/current source 150 through electrical conductors 160 with a forward bias, such that anode 110 is at a more positive potential with respect to the cathode 140, the $1^{st}$ EL unit and the $2^{nd}$ EL unit emit blue light and red light, respectively. The viewer can then perceive a white color from one transparent electrode of the device. The white color is the combination of the red light and the blue light.

Figure 2:
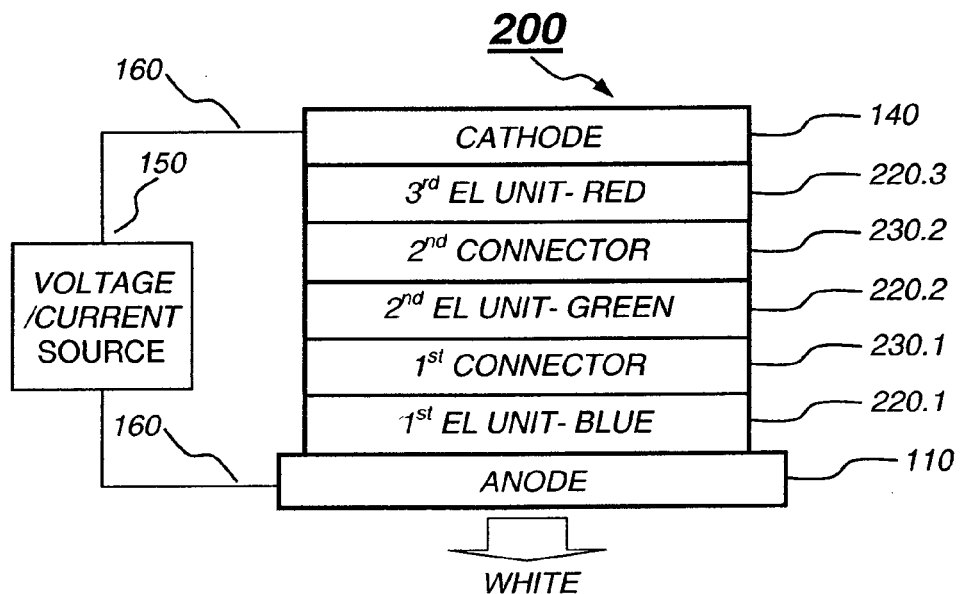
FIG. 2 depicts a schematic cross sectional view of another prior art tandem white OLED device having three EL units with different colors of emission.

FIG. 2 shows another prior art tandem white OLED device 200. This tandem white OLED device has an anode 110 and a cathode 140. Disposed between the anode and the cathode are one blue EL unit 220.1 ($1^{st}$ EL unit—blue), one green EL unit 220.2 ($2^{nd}$ EL unit—green), and one red EL unit 220.3 ($3^{rd}$ EL unit—red). These three organic EL units are stacked and connected serially to each other using two intermediate connectors, 230.1 ($1^{st}$ connector) and 230.2 ($2^{nd}$ connector), respectively. When the tandem white OLED device 200 is externally connected to a voltage/current source 150 through electrical conductors 160 with a forward bias, the three EL units emit the blue, green, and red light, respectively.

The viewer can then perceive a white color from one transparent electrode of the device. The white color is the combination of the red, green, and blue light.

The construction of a tandem white OLED device using multiple EL units having different primary color emissions from each of the EL units is well known in the art. Since the blue emission from the blue EL unit typically degrades faster than the other color emissions from the other EL units resulting in a continued color shift, it is difficult for the prior art tandem white OLED device to maintain the initial white color. Moreover, since each EL unit has different layer structures for different color emission, it requires more evaporation sources and a longer time to fabricate this tandem OLED device.

Figure 3:
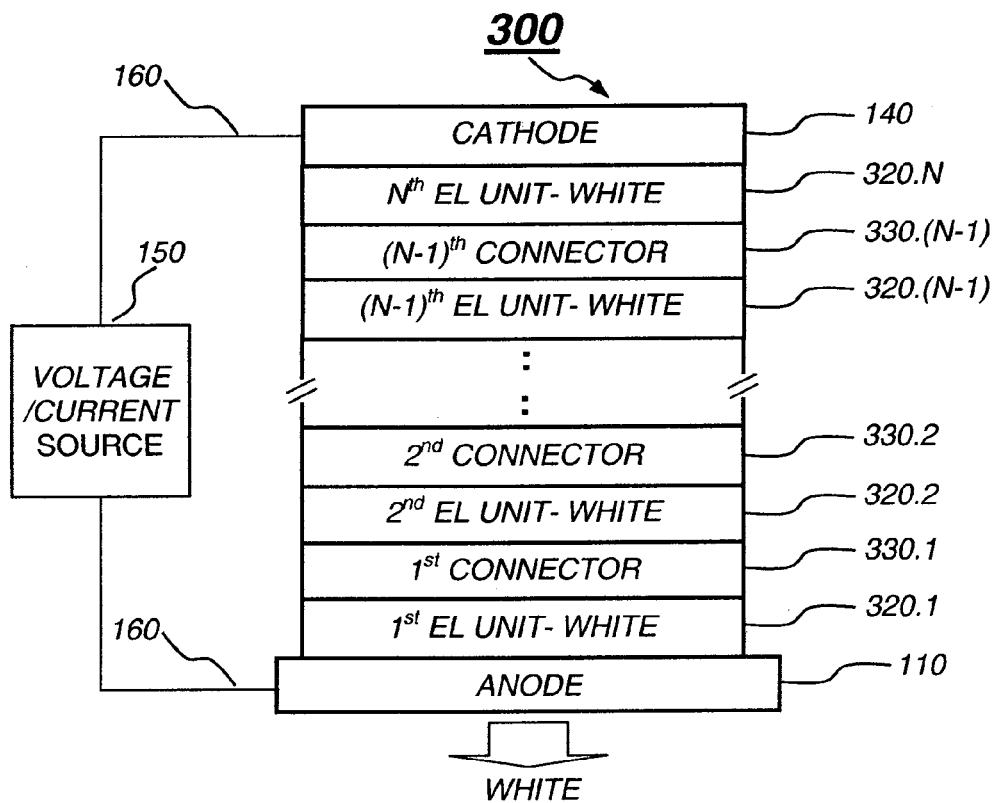
FIG. 3 depicts a schematic cross sectional view of a tandem white OLED device having N(N>1) white EL units connected in series by N−1 intermediate connectors, in accordance with the present invention.

Turning now to FIG. 3, there is shown a cross-sectional view of a tandem white OLED device 300 in accordance with the present invention. This tandem white OLED device has an anode 110 and a cathode 140, at least one of which is transparent. Disposed between the anode and the cathode are N white organic EL unit 320.x, where N and x are integers greater than 1, while x is a variable less than or equal to N. These white organic EL units, stacked and connected serially to each other and to the anode and the cathode, are designated 320.1 to 320.N where 320.1 is the first EL unit (adjacent to the anode) and 320.N is the $N^{th}$ unit (adjacent to the cathode). The term EL unit 320.x represents any of the EL units named from 320.1 to 320.N in the present invention. Disposed between any two adjacent white organic EL units is an intermediate connector (or connector) 330.x. There are a total of N−1 intermediate connectors associated with N white organic EL units and they are designated 330.1 to 330.(N−1). Intermediate connector 330.1 is disposed between white organic EL units 320.1 and 320.2, intermediate connector 330.2 is disposed between white organic EL unit 320.2 and the next EL unit, and intermediate connector 330.(N−1) is disposed between white organic EL units 320.(N−1) and 320.N. The term intermediate connector 330.x represents any of the connectors named from 330.1 to 330.(N−1) in the present invention. The tandem white OLED device 300 is externally connected to a voltage/current source 150 through electrical conductors 160.

Tandem white OLED device 300 is operated by applying an electric potential produced by a voltage/current source 150 between a pair of contact electrodes, anode 110 and cathode 140. Under a forward bias, this externally applied electrical potential is distributed among the N white organic EL units in proportion to the electrical resistance of each of these units. The electric potential across the tandem white OLED device causes holes (positively charged carriers) to be injected from anode 110 into the $1^{st}$ white organic EL unit 320.1, and electrons (negatively charged carriers) to be injected from cathode 140 into the $N^{th}$ white organic EL unit 320.N. Simultaneously, electrons and holes are produced in, and separated from, each of the intermediate connectors, (330.1-330.(N-1)). Electrons thus produced in, for example, intermediate connector 330.(N-1) are injected towards the anode and into the adjacent white organic EL unit 320.(N-1). Likewise, holes produced in the intermediate connector 330.(N-1) are injected towards the cathode and into the adjacent white organic EL unit 320.N. Subsequently, these electrons and holes recombine in their corresponding white organic EL units to produce white light, which is observed via the transparent electrode or electrodes of the OLED device.

Figure 4:
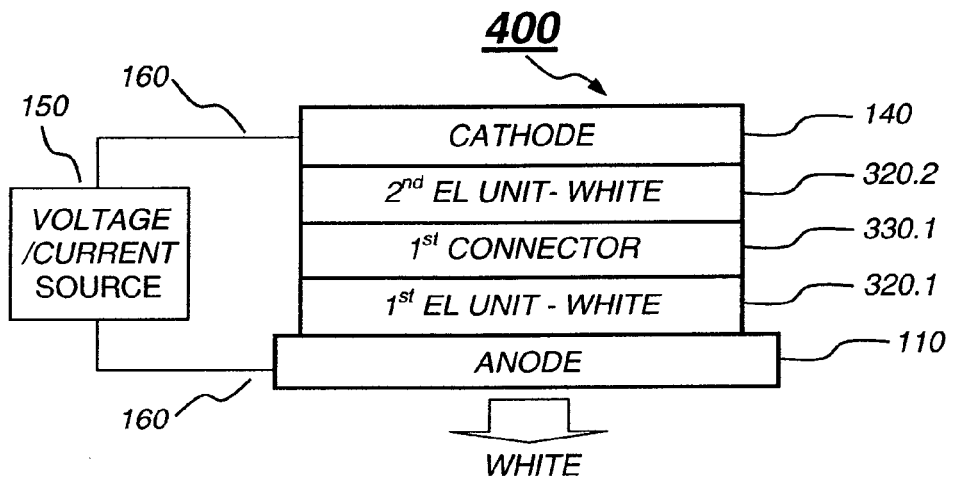
FIG. 4 depicts a schematic cross sectional view of a specific tandem white OLED device having two white EL units connected in series by one intermediate connector, in accordance with the present invention.

Shown in FIG. 4 is a simplified tandem white OLED device 400 having two white organic EL units and one intermediate connector, which is the case when N is equal to 2 in FIG. 3.

Each white organic EL unit in the tandem white OLED device 300 is capable of supporting hole transport, electron transport, and electron-hole recombination to produce light. Each white organic EL unit can comprise a plurality of layers. There are many white organic EL multilayer structures known in the art that can be used as the white organic EL unit of the present invention. These include, HTL/(LEL or LELs)/ETL, hole-injecting layer (HIL)/HTL/(LEL or LELs)/ETL, HIL/HTL/(LEL or LELs)/ETL/electron-injecting layer (EIL), HIL/HTL/electron-blocking layer or hole-blocking layer/(LEL or LELs)/ETL/EIL, HIL/HTL/(LEL or LELs)/hole-blocking layer/ETL/EIL. Each white organic EL unit in the tandem white OLED device can have the same or different layer structures from other white organic EL units provided that each EL unit produces white light. The layer structure of the $1^{st}$ white organic EL unit adjacent to the anode preferably is of HIL/HTL/(LEL or LELs)/ETL, the layer structure of the $N^{th}$ white organic EL unit adjacent to the anode preferably is of HTL/(LEL or LELs)/ETL/EIL, and the layer structure of the other white organic EL units preferably is of HTL/(LEL or LELs)/ETL. However, in considering the simplicity of the fabrication, it is preferable that each white organic EL unit in the tandem white OLED device has the same layer structure. In some instances, when the thickness of the LEL adjacent to the ETL is thicker than 20 nm, the ETL can be simply replaced by an EIL, and the EIL then serves the function of supporting both electron injection and electron transport.

Figure 5:
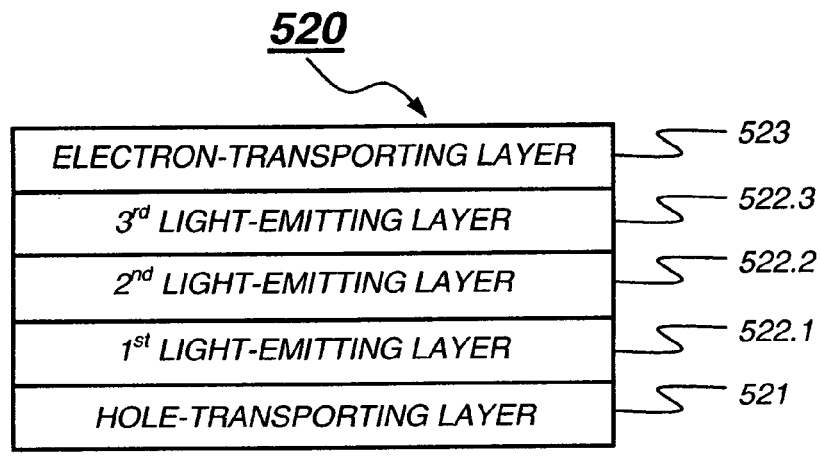
FIG. 5 depicts a schematic cross sectional view of an electroluminescence unit including three light-emitting layers in the tandem white OLED device, in accordance with the present invention.
Figure 6:
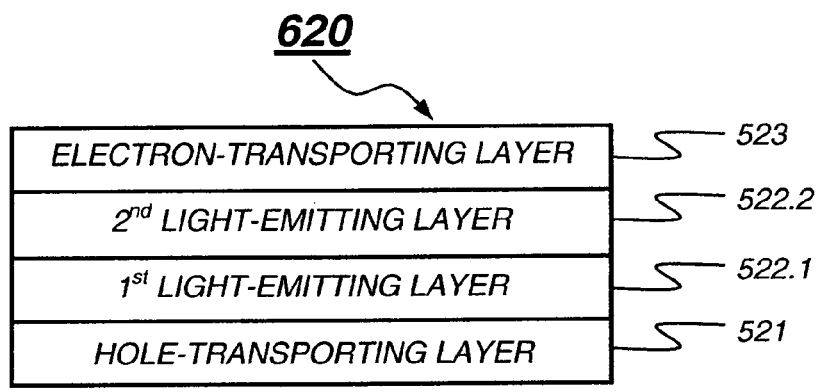
FIG. 6 depicts a schematic cross sectional view of another electroluminescence unit including two light-emitting layers in the tandem white OLED device, in accordance with the present invention.
Figure 7:
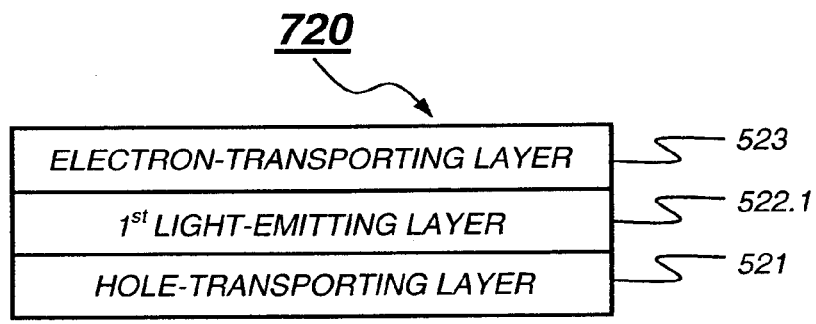
FIG. 7 depicts a schematic cross sectional view of another electroluminescence unit including one light-emitting layer in the tandem white OLED device, in accordance with the present invention.

Considering the number of the LELs within a specific white organic EL unit in the tandem white OLED device 300, the number of LELs can be changed typically from 3 to 1. Therefore, the white organic EL unit can include at least one HTL and three LELs, wherein each of the LELs has a different color of emission. The white organic EL unit can also include at least one HTL and two LELs, wherein each of the LELs has a different color of emission. The white organic EL unit can also include at least one HTL and one LEL having white color emission. FIG. 5 (EL unit 520) shows one embodiment of the EL unit 320.x in the tandem white OLED device 300 in accordance with the present invention, wherein the EL unit 520 has an HTL 521, a $1^{st}$ LEL 522.1, a $2^{nd}$ LEL 522.2, a $3^{rd}$ LEL 522.3, and an ETL 523. FIG. 6 (EL unit 620) shows another embodiment of the EL unit 320.x in the tandem white OLED device 300 in accordance with the present invention, wherein the EL unit 620 has an HTL 521, a $1^{st}$ LEL 522.1, a $2^{nd}$ LEL 522.2, and an ETL 523. FIG. 7 (EL unit 720) shows yet another embodiment of the EL unit 320.x in the tandem white OLED device 300 in accordance with the present invention, wherein the EL unit 720 has an HTL 521, a $1^{st}$ LEL 522.1, and an ETL 523. The LELs in each of the EL units can have the same or different colors of emission provided that each EL unit produces white light.

The organic layers in the white organic EL units can be formed from small molecule OLED materials (or nonpolymeric) or polymeric LED materials, both known in the art, or combinations thereof. The corresponding organic layer in each white organic EL unit in the tandem white OLED device can be formed using the same materials or different materials from those of the other corresponding organic layers.

The materials used to construct the white organic EL units can be the same materials as used to construct the conventional white OLED devices disclosed by the prior art, such as U.S. Patent Application Publication 2002/0025419 A1, U.S. Pat. Nos. 5,683,823, 5,503,910, 5,405,709, 5,283,182, EP 1 187 235, EP 1 182 244, and JP 07-142169.

Each of the LELs of the white organic EL unit includes luminescent material(s) where electroluminescence is produced as a result of electron-hole pair recombination in this region. It is also possible for recombination in one LEL to produce luminescence in another LEL by way of an energy transfer process. While LELs can be comprised of a single material, they more commonly include host material(s) doped with guest compound(s) or dopant(s) where light emission comes primarily from the dopant(s). The practice of the present invention concerns such host/dopant LELs in the white organic OLED devices. The dopants are selected to produce colored light. The dopants are typically chosen from highly fluorescent dyes or phosphorescent dyes, and are typically coated 0.01 to 10% by weight into the host materials.

Host and dopant materials known to be of use in LELs include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula A) constitute one class of useful host compounds capable of supporting electroluminescence, and are particularly suitable for light emission of wavelengths longer than 500 nm, e.g., green, yellow, orange, and red,

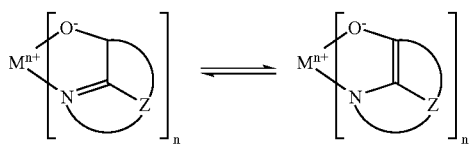

A wherein:

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is typically maintained at 18 or less.

Derivatives of 9,10-di-(2-naphthyl)anthracene (Formula B) constitute another class of useful hosts capable of supporting electroluminescence, and are particularly suitable for light emission of wavelengths longer than 400 nm, e.g., blue, green, yellow, orange or red,

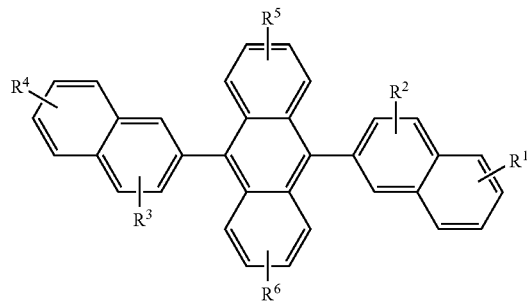

B wherein $R^1$, $R^2$, $R^3$, $R^4$, $R^5$, and $R^6$ represent one or more substituents on each ring where each substituent can be individually selected from the following groups:

Group 1: hydrogen, alkenyl, alkyl, or cycloalkyl of from 1 to 24 carbon atoms;

Group 2: aryl or substituted aryl of from 5 to 20 carbon atoms;

Group 3: carbon atoms from 4 to 24 necessary to complete a fused aromatic ring such as anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

The mono-anthracene derivative of Formula (C) is also a useful host material capable of supporting electroluminescence, and is particularly suitable for light emission of wavelengths longer than 400 nm, e.g., blue, green, yellow, orange or red. Mono-anthracene derivatives of Formula (C) are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference,

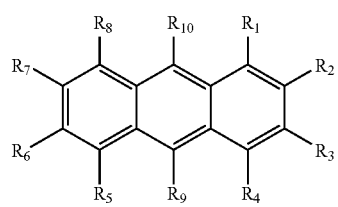

C wherein:

$R_1$-$R_8$ are H;

$R_9$ is a naphthyl group containing no fused rings with aliphatic carbon ring members, provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that it forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Benzazole derivatives (Formula D) constitute another class of useful hosts capable of supporting electrolumines cence, and are particularly suitable for light emission of wavelengths longer than 400 nm, e.g., blue, green, yellow, orange or red,

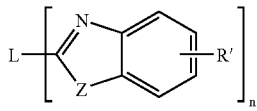

D wherein:

n is an integer of 3 to 8;

Z is O, NR or S;

R and R' are individually hydrogen, alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems, or halo such as chloro, fluoro, or atoms necessary to complete a fused aromatic ring; and there can be up to 4 R' groups per benzazole unit; and L is a linkage unit including alkyl, aryl, substituted alkyl, or substituted aryl, which conjugately or unconjugately connects the multiple benzazoles together.

An example of a useful benzazole is 2, 2', 2"-(1,3,5-phenylene)tris-[1-phenyl-1H-benzimidazole].

Distyrylarylene derivatives as described in U.S. Pat. No. 5,121,029 are also useful host material for the LEL.

Other organic light-emitting host materials can be polymeric substances, e.g. polyphenylenevinylene derivatives, dialkoxy-polyphenylene-vinylenes, poly-para-phenylene derivatives, and polyfluorene derivatives, as taught by Wolk et al. in commonly assigned U.S. Pat. No. 6,194,119 and references cited therein.

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrylium, and thiapyrylium compounds, derivatives of distyrylbenzene or distyrylbiphenyl, bis(azinyl)methane boron complex compounds, and carbostyryl compounds.

A suitable light-emitting red dopant can include a diindenoperylene compound of the following structure:

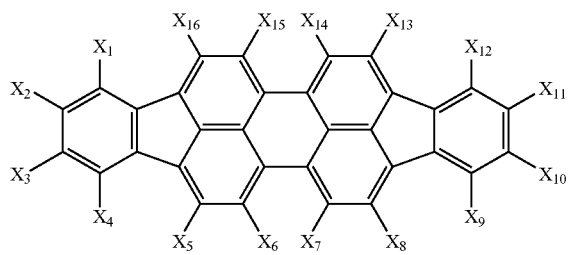

wherein $X_1$-$X_{16}$ are independently selected as hydro or substituents that provide red luminescence. A particularly preferred diindenoperylene dopant is dibenzo{[f,f']-4,4'7,7'-tetraphenyl]diindeno-[1,2,3-cd:1',2',3'-lm]perylene (TP-DBP).

Other red dopants useful in the present invention belong to the DCM class of dyes represented by:

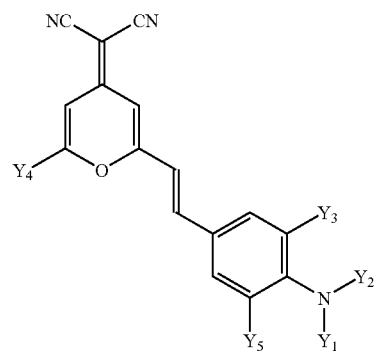

wherein:

$Y_1$-$Y_5$ represent one or more groups independently selected from hydro, alkyl, substituted alkyl, aryl, or substituted aryl; and $Y_1$-$Y_5$ independently include acyclic groups or are joined pairwise to form one or more fused rings, provided that $Y_3$ and $Y_5$ do not together form a fused ring.

In a useful and convenient embodiment that provides red luminescence, $Y_1$-$Y_5$ are selected independently from hydro, alkyl and aryl.

A preferred DCM dopant is

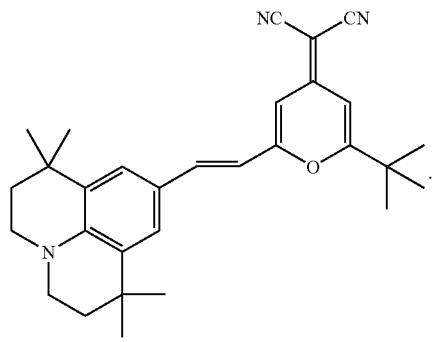

DCJTB

A useful red dopant can also be a mixture of compounds that would also be red dopants individually.

A light-emitting yellow dopant can include a compound of the following structures:

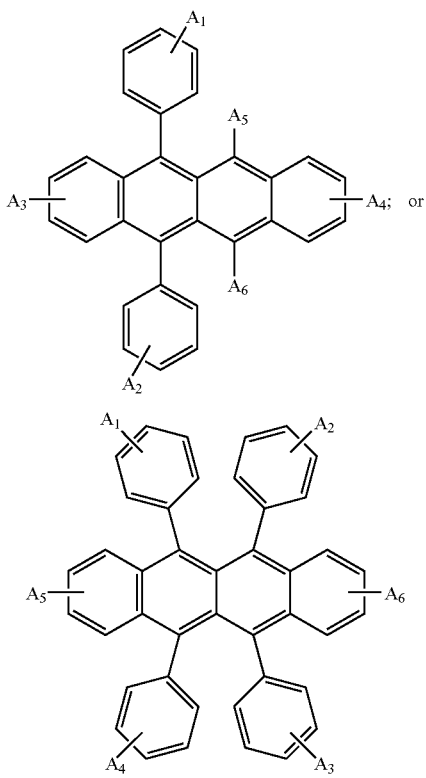

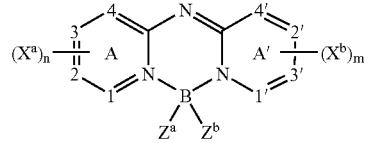

wherein:
A and A' represent independent azine ring systems corresponding to 6-membered aromatic ring systems containing at least one nitrogen;
$(X^a)_n$ and $(X^b)_m$ represent one or more independently selected substituents and include acyclic substituents or are joined to form a ring fused to A or A';
m and n are independently 0 to 4;
$Z^a$ and $Z^b$ are independently selected substituents;
1, 2, 3, 4, 1', 2', 3', and 4' are independently selected as either carbon or nitrogen atoms; and
provided that $X^a$, $X^b$, $Z^a$, and $Z^b$, 1, 2, 3, 4, 1', 2', 3', and 4' are selected to provide blue luminescence.

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes and bis[2-[4-[N,N-diarylamino]phenyl]vinyl]biphenyls.

A particularly preferred blue dopant of this class is 1,4-bis[2-[4-[N,N-di(p-tolyl)amino]phenyl]vinyl]benzene (BDTAPVB).

Each white organic EL unit can be selected in order to improve performance or achieve a desired attribute, for example, light transmission through the OLED multilayer structure, drive voltage, luminance efficiency, manufacturability, device stability, and so forth. The number of white organic EL units in the tandem white OLED device is, in principle, equal to or more than 2. Preferably, the number of the white organic EL units in the tandem white OLED device is such that the luminance efficiency in units of cd/A is improved or maximized. For lamp applications, the number of white organic EL units can be determined according to the maximum voltage of the power supply.

In order to reduce drive voltage for the tandem white OLED device, it is desirable to make each white organic EL unit as thin as possible without compromising the electroluminescence efficiency. It is preferable that each white organic EL unit is less than 500 nm thick, and more preferable that it be 2-250 nm thick. It is also preferable that each layer within the white organic EL unit be 200 nm thick or less, and more preferable that it be 0.1-100 nm. It is also preferable that the thickness of each LEL in the white organic EL unit be in the range of from 5 nm to 50 nm.

For a tandem white OLED device to function efficiently, it is necessary that the intermediate connector should provide effective carrier injection into the adjacent white organic EL units. Due to their lower resistivity than that of organic materials, metals, metal compounds, or other inorganic compounds can be effective for carrier injection.

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants include 5,6,11,12-tetraphenylnaphthacene (rubrene); 6,11-diphenyl-5,12-bis(4-(6-methyl-benzo-thiazol-2-yl)phenyl)naphthacene (DBzR) and 5,6,11,12-tetra(2-naphthyl)-naphthacene (NR).

A suitable yellow dopant can also be a mixture of compounds that would also be yellow dopants individually.

The light-emitting blue dopant can include perylene or derivatives thereof, blue-emitting derivatives of distyrylbenzene or a distyrylbiphenyl that have one or more aryl amine substituents, or a compound of the structure:

However, low resistivity can cause low sheet resistance resulting in pixel crosstalk. If the lateral current passing through the adjacent pixels to cause pixel crosstalk is limited to less than 10% of the current used to drive a pixel, the lateral resistance of the intermediate connector ($R_{ic}$) should be at least 8 times the resistance of the tandem white OLED device. Typically, the static resistance between two electrodes of a conventional OLED is about several kΩs, and a tandem white OLED device should have a resistance of about 10 kΩ or several 10 kΩs between the two electrodes. Therefore $R_{ic}$ should be greater than 100 kΩ. Considering the space between each pixel is smaller than one square, the sheet resistance of the intermediate connector should be then greater than 100 kΩ per square (lateral resistance equals to sheet resistance times the number of square). Because the sheet resistance is determined by both the resistivity and the thickness of the films (sheet resistance equals film resistivity divided by film thickness), when the layers constituting an intermediate connector are selected from metals, metal compounds, or other inorganic compounds having low resistivity, a sheet resistance of the intermediate connector greater than 100 kΩ per square can still be achieved if the layers are thin enough. If organic materials are used for the construction of the intermediate connector, there will be no pixel crosstalk because the electrical resistance is high enough. However, a pure organic layer cannot facilitate carrier injection or carrier generation within the intermediate connector. Therefore, doped organic layers with improved semiconducting properties can be useful as the intermediate connectors.

Another requirement for the tandem white OLED device to function efficiently is that the optical transparency of the layers constituting the white organic EL units and the intermediate connectors be as high as possible to permit for radiation produced in the white organic EL units to exit the device. According to a simple calculation, if the optical transmission of each intermediate connector is 70% of the emitting light, a tandem white OLED device will not have much benefit because no matter how many EL units there are in the device, the electroluminescence efficiency can never be doubled when comparing to a conventional device. The layers constituting the white organic EL units are generally optically transparent to the radiation produced by the EL units, and therefore their transparency is generally not a concern for the construction of the tandem white OLED devices. As is known, metals, metal compounds, or other inorganic compounds can have low transparency. However, when the layers constituting an intermediate connector are selected from metals, metal compounds, or other inorganic compounds, an optical transmission higher than 70% can still be achieved if the layers are thin enough. Preferably, the intermediate connector has at least 75% optical transmission in the visible region of the spectrum.

Figure 8:
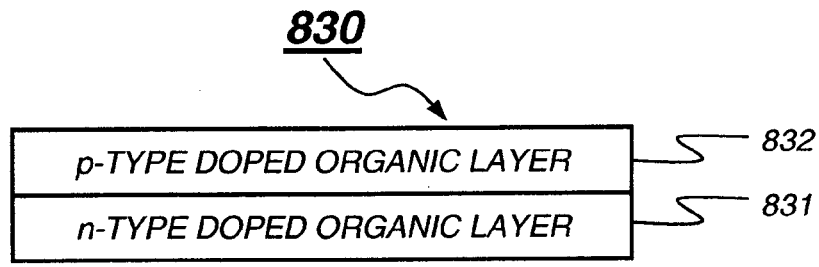
FIG. 8 depicts a schematic cross sectional view of an intermediate connector having an n-type doped organic and a p-type doped organic layer in the tandem white OLED device, in accordance with the present invention.
Figure 9:
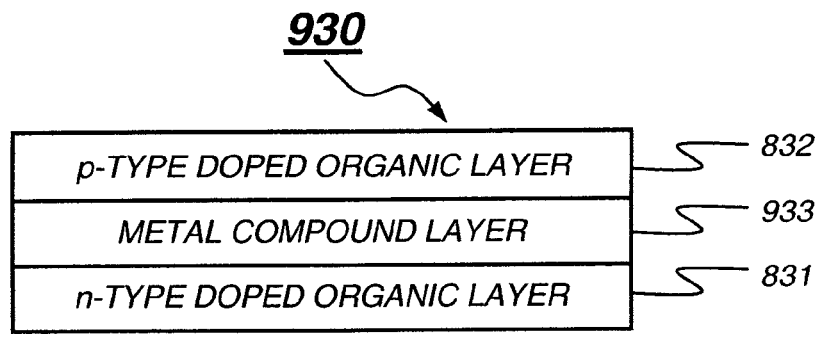
FIG. 9 depicts a schematic cross sectional view of another intermediate connector having an n-type doped organic layer, a metal compound layer, and a p-type doped organic layer in the tandem white OLED device, in accordance with the present invention.
Figure 10:
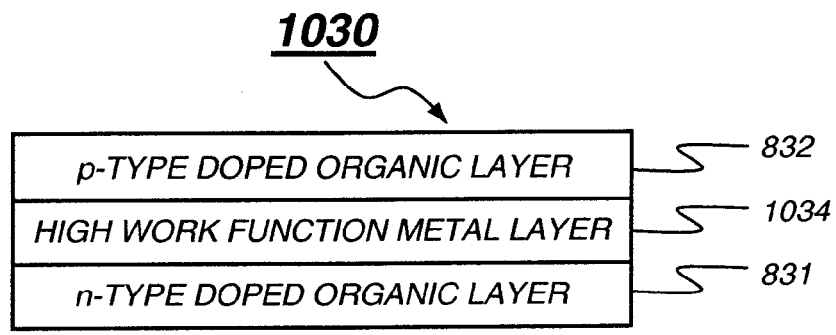
FIG. 10 depicts a schematic cross sectional view of another intermediate connector having an n-type doped organic, a high work function metal layer, and a p-type doped organic layer in the tandem white OLED device, in accordance with the present invention.
Figure 11:
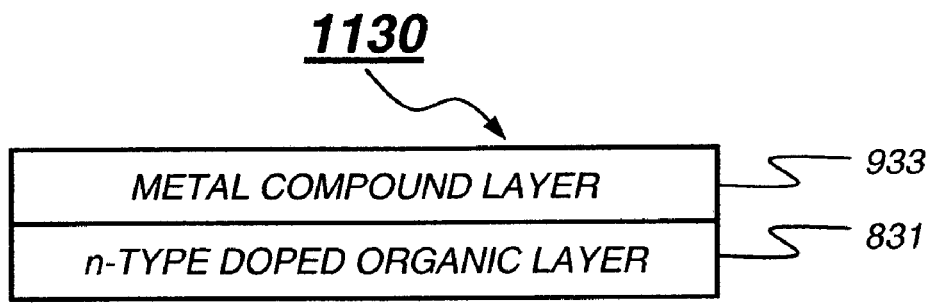
FIG. 11 depicts a schematic cross sectional view of another intermediate connector having an n-type doped organic and a metal compound layer in the tandem white OLED device, in accordance with the present invention.
Figure 12:
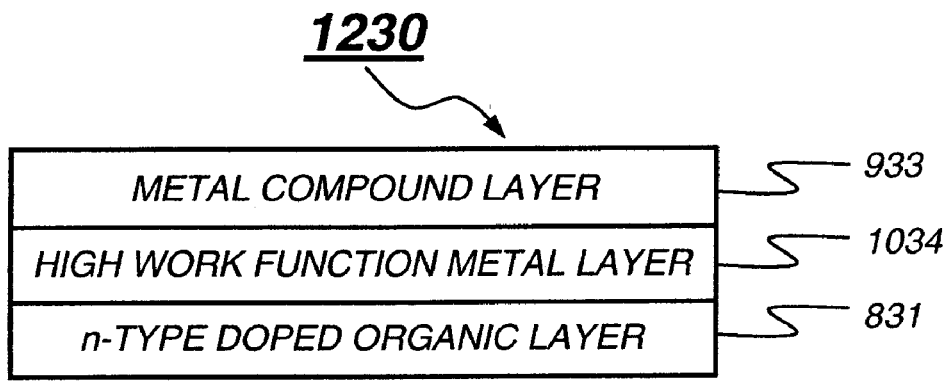
FIG. 12 depicts a schematic cross sectional view of another intermediate connector having an n-type doped organic, a high work function metal layer, and a metal compound layer in the tandem white OLED device, in accordance with the present invention.
Figure 13:
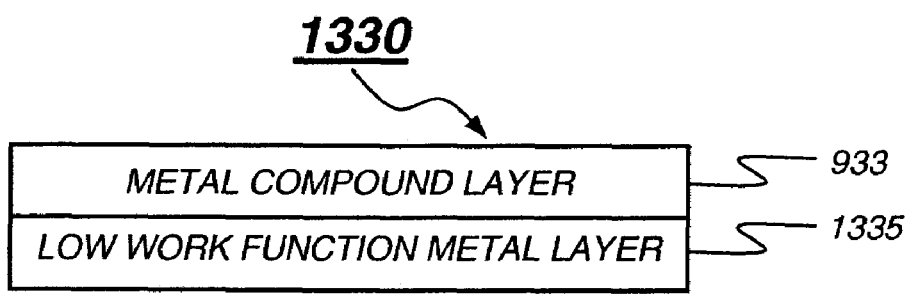
FIG. 13 depicts a schematic cross sectional view of another intermediate connector having a low work function metal layer and a metal compound layer in the tandem white OLED device, in accordance with the present invention.
Figure 14:
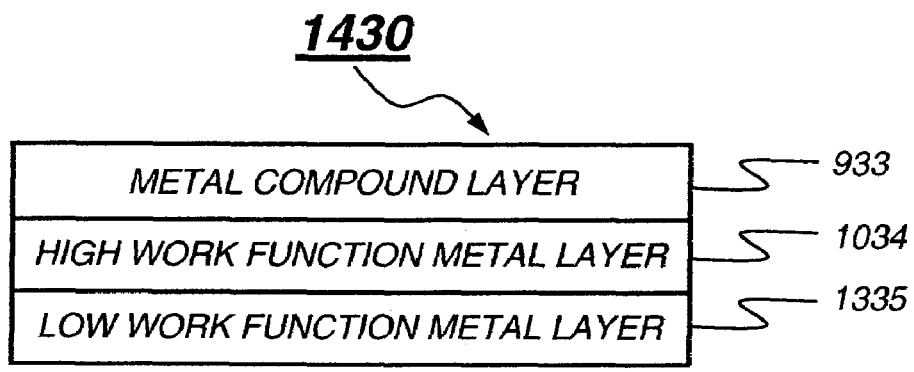
FIG. 14 depicts a schematic cross sectional view of another intermediate connector having a low work function metal layer, a high work function metal layer, and a metal compound layer in the tandem white OLED device, in accordance with the present invention.
Figure 15:
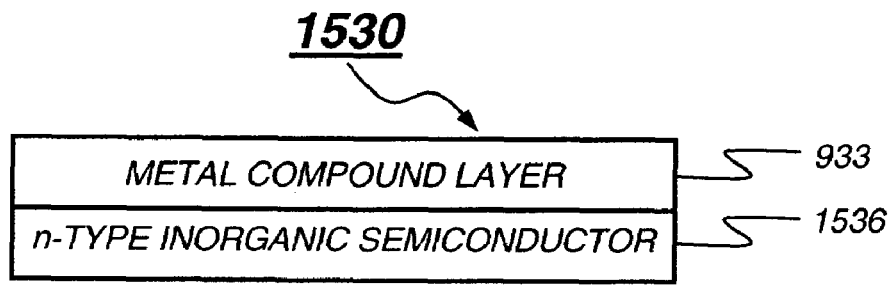
FIG. 15 depicts a schematic cross sectional view of another intermediate connector having an n-type inorganic semiconductor layer and a metal compound layer in the tandem white OLED device, in accordance with the present invention.
Figure 16:
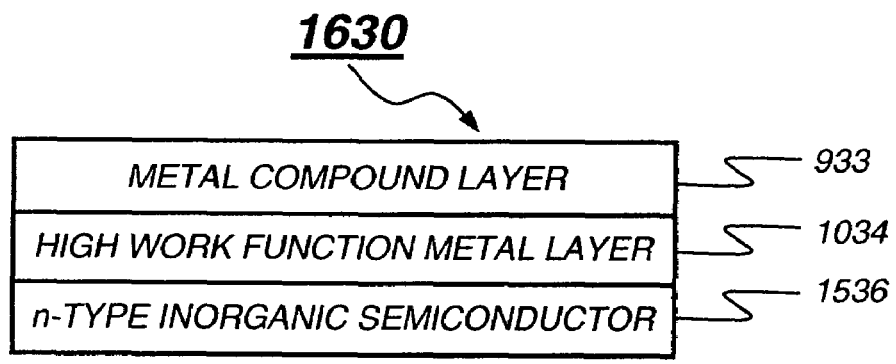
FIG. 16 depicts a schematic cross sectional view of another intermediate connector having an n-type inorganic semiconductor layer, a high work function metal layer, and a metal compound layer in the tandem white OLED device, in accordance with the present invention.

Therefore, the intermediate connectors provided between adjacent white organic EL units are crucial, as they are needed to provide for efficient electron and hole injection into the adjacent white organic EL units without causing pixel crosstalk and without compromising the optical transparency. Shown from FIG. 8 to FIG. 16 are typical embodiments of the intermediate connectors in the present invention, wherein the intermediate connector disposed between each adjacent organic EL unit includes at least two different layers without direct connection to an external power source. These two or more than two different layers in the intermediate connector can be comprised of all organic materials, or partially organic materials, or all inorganic materials, provided that they can have both effective carrier injection and effective optical transparency. Shown in FIG. 8 is an intermediate connector 830 including an n-type doped organic layer 831 disposed adjacent to the ETL of the preceding organic EL unit and a p-type doped organic layer 832 disposed over the n-type doped organic layer 831. Shown in FIG. 9 is an intermediate connector 930 including, in sequence, an n-type doped organic layer 831 disposed adjacent to the ETL of the preceding organic EL unit, a metal compound layer 933, and a p-type doped organic layer 832. Shown in FIG. 10 is an intermediate connector 1030 including, in sequence, an n-type doped organic layer 831 disposed adjacent to the ETL of the preceding organic EL unit, a high work function metal layer 1034, and a p-type doped organic layer 832. Shown in FIG. 11 is an intermediate connector 1130 including an n-type doped organic layer 831 disposed adjacent to the ETL of the preceding organic EL unit and a metal compound layer 933 disposed over the n-type doped organic layer 831, wherein the intermediate connector has a sheet resistance of higher than 100 kΩ per square. Shown in FIG. 12 is an intermediate connector 1230 including, in sequence, an n-type doped organic layer 831 disposed adjacent to the ETL of the preceding organic EL unit, a high work function metal layer 1034, and a metal compound layer 933, wherein the intermediate connector has a sheet resistance of higher than 100 kΩ per square. Shown in FIG. 13 is an intermediate connector 1330 including a low work function metal layer 1335 disposed adjacent to the ETL of the preceding organic EL unit and a metal compound layer 933 disposed over the low work function metal layer 1335, wherein the intermediate connector has a sheet resistance of higher than 100 kΩ per square. Shown in FIG. 14 is an intermediate connector 1430 including, in sequence, a low work function metal layer 1335 disposed adjacent to the ETL of the preceding organic EL unit, a high work function metal layer 1034, and a metal compound layer 933, wherein the intermediate connector has a sheet resistance of higher than 100 kΩ per square. Shown in FIG. 15 is an intermediate connector 1530 including an n-type inorganic semiconductor layer 1536 disposed adjacent to the ETL of the preceding organic EL unit and a metal compound layer 933 disposed over the n-type inorganic semiconductor layer 1536, wherein the intermediate connector has a sheet resistance of higher than 100 kΩ per square. Shown in FIG. 16 is an intermediate connector 1630 including, in sequence, an n-type inorganic semiconductor layer 1536 disposed adjacent to the ETL of the preceding organic EL unit, a high work function metal layer 1034, and a metal compound layer 933, wherein the intermediate connector has a sheet resistance of higher than 100 kΩ per square. Moreover, in the tandem white OLED device, each of the intermediate connectors can have the same or different layer structures.

The n-type doped organic layer 831 in the aforementioned intermediate connectors contains at least one organic host material and one n-type dopant, wherein the organic host material is capable of supporting electron transport. The organic electron-transporting materials used in conventional OLED devices represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang (U.S. Pat. No. 4,356,429), various heterocyclic optical brighteners as disclosed by Van Slyke and Tang et al. (U.S. Pat. No. 4,539,507), triazines, hydroxyquinoline derivatives, benzazole derivatives, and phenanthroline derivatives. Silole derivatives, such as 2,5-bis(2',2"-bipridin-6-yl)-1,1-dimethyl-3,4-diphenyl silacyclopentadiene are also useful organic host materials. The combination of the aforementioned materials is also useful to form the n-typed doped organic layer. More preferably, the organic host material in the n-type doped organic layer 831 includes Alq, 4,7-diphenyl-1,10-phenanthroline (Bphen), 2,9-dimethyl-4,7-diphenyl-1,10-phenanthroline (BCP), 2,2'-[1,1'-biphenyl]-4,4'-diylbis[4,6-(p-tolyl)-1,3,5-triazine] (TRAZ), or combinations thereof.

The n-type dopant in the n-type doped organic layer 831 includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Tb, Dy, or Yb, and their compounds, are particularly useful. The materials used as the n-type dopants in the n-type doped organic layer of the doped organic connectors also include organic reducing agents with strong electron-donating properties. "Strong electron-donating properties" means that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Preferably, the n-type dopant in the n-type doped organic layer 831 includes Li, Na, K, Rb, Cs, Mg, Ca, Sr, Ba, La, Ce, Nd, Sm, Eu, Tb, Dy, or Yb, or combinations thereof. The n-type doped concentration is preferably in the range of 0.01-20 vol. %. The thickness of the n-type doped organic layer is typically less than 150 nm, and preferably in the range of about 1 to 100 nm.

In the case that there is an n-type doped organic layer 831 in the intermediate connector, it is not necessary to use an EIL in the adjacent white organic EL unit because this n-type doped organic layer 831 can facilitate the electron injection in both the adjacent white organic EL unit and the intermediate connector.

The p-type doped organic layer 832 in the aforementioned intermediate connectors contains at least one organic host material and one p-type dopant, wherein the organic host material is capable of supporting hole transport. The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Other suitable triarylamines substituted with one or more vinyl radicals and/or comprising at least one active hydrogen-containing group are disclosed by Brantley et al. in U.S. Pat. Nos. 3,567,450 and 3,658,520. A more preferred class of aromatic tertiary amines are those which include at least two aromatic tertiary amine moieties as described by Van Slyke and Tang et al. in U.S. Pat. Nos. 4,720,432 and 5,061,569. Non-limiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB). Another preferred class of aromatic amines are dihydrophenazine compounds as described in commonly assigned U.S. patent application Ser. No. 10/390,973 filed Mar. 18, 2003 by Kevin P. Klubek et al., entitled "Cascaded Organic Electroluminescent Devices", the disclosure of which is herein incorporated by reference. The combination of the aforementioned materials is also useful to form the p-typed doped organic layer. More preferably, the organic host material in the p-type doped organic layer 832 includes NPB, TPD, TNB, 4,4',4"-tris(N-3-metylphenyl-N-phenyl-amino)-triphenylamine (m-MTDATA), 4,4',4"-tris(N,N-diphenyl-amino)-triphenylamine (TDATA), or dihydrophenazine compounds, or combinations thereof.

The p-type dopant in the p-type doped organic layer 832 includes oxidizing agents with strong electron-withdrawing properties. "Strong electron-withdrawing properties" means that the organic dopant should be able to accept some electronic charge from the host to form a charge-transfer complex with the host material. Some non-limiting examples include organic compounds such as 2,3,5,6-tetrafluoro-7,7,8,8-tetracyanoquinodimethane ($F_4$-TCNQ) and other derivatives of 7,7,8,8-tetracyanoquinodimethane (TCNQ), and inorganic oxidizing agents such as iodine, $FeCl_3$, $FeF_3$, $SbCl_5$, some other metal chlorides, and some other metal fluorides. The combination of p-type dopants is also useful to form the p-type doped organic layer 832. The p-type doped concentration is preferably in the range of 0.01-20 vol. %. The thickness of the p-type doped organic layer is typically less than 150 nm, and preferably in the range of about 1 to 100 nm.

The host materials used in the intermediate connectors can comprise small molecule materials or polymeric materials, or combinations thereof. In some instances, the same host material can be used for both n-type and p-type doped organic layers, provided that it exhibits both hole and electron transport properties set forth above. Examples of materials that can be used as host for either the n-type or p-type doped organic layers include, but are not limited to, various anthracene derivatives as described in U.S. Pat. No. 5,972,247, certain carbazole derivatives such as 4,4-bis(9-dicarbazolyl)-biphenyl (CBP), and distyrylarylene derivatives such as 4,4'-bis(2,2'-diphenyl vinyl)-1,1'-biphenyl, and as described in U.S. Pat. No. 5,121,029.

The metal compound layer 933 in the intermediate connector 930 as shown in FIG. 9 is mainly used to stop the possible interdiffusion between the n-typed doped organic layer and the p-type doped organic layer and to stabilize the drive voltage during operation. In the other cases, such as shown in FIGS. 11-16, when the metal compound layer 933 is the top layer of the intermediate connector (or the metal compound layer 933 is adjacent to the HTL of the next white organic EL unit), this layer can modify the interface between this layer and the HTL, and improve the hole injection between the intermediate connector and the white organic EL unit.

The metal compound layer 933 can be selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The metal compound layer 933 can be selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 933 can be selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 933 can be selected from the stoichiometric tellurides or nonstoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 933 can be selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The metal compound layer 933 can also be selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. The metal compound layer 933 can be selected from $MoO_3$, $NiMoO_4$, $CuMoO_4$, $WO_3$, ZnTe, $Al_4C_3$, $AlF_3$, $B_2S_3$, CuS, GaP, InP, or SnTe. Preferably, the metal compound layer 333 is selected from $MoO_3$, $NiMoO_4$, $CuMoO_4$, or $WO_3$.

The high work function metal layer 1034 inserted in the middle of the intermediate connectors is mainly used to stop possible interdiffusion and facilitate the carrier injection between the other two layers in the intermediate connectors. The high work function metal used to form this layer has a work function no less than 4.0 eV and includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer 1034 includes Ag, Al, Cu, Au, Zn, In, or Sn, or combinations thereof. More preferably, the high work function metal layer 1034 includes Ag or Al.

The low work function metal layer 1135 in the intermediate connectors is mainly used to modify the interface between this layer and the ETL of the preceding white organic EL unit to improve the electron injection between the intermediate connector and the white organic EL unit. The low work function metal used to form this layer has a work function less than 4.0 eV and includes Li, Na, K, Rb, Cs, Mg, Ca, Sr, Ba, La, Ce, Nd, Sm, Eu, Tb, Dy, or Yb, or combinations thereof. Preferably, the low work function metal layer 1135 includes Li, Na, Cs, Ca, Ba, or Yb.

The n-type inorganic semiconductor layer 1536 in the intermediate connectors is mainly used to modify the interface between this layer and the ETL of the preceding white organic EL unit and improve the electron injection between the intermediate connector and the white organic EL unit. The n-type inorganic semiconductor layer 1536 includes, but is not limited to, ZnSe, ZnS, ZnSSe, SnSe, SnS, SnSSe, $LaCuO_3$, or $La_4Ru_6O_{19}$. Preferably, the n-type inorganic semiconductor layer 1536 includes ZnSe or ZnS.

In the case that there is an n-type inorganic semiconductor layer 1536 in the intermediate connector, it is not necessary to use an EIL in the adjacent white organic EL unit because this n-type inorganic semiconductor layer 1536 can facilitate electron injection in both the adjacent white organic EL unit and the intermediate connector.

The thickness of each layer in the intermediate connector is in the range of from 0.1 nm to 150 nm. The thickness of the metal compound layer 933 in the intermediate connector is in the range of from 0.5 nm to 20 nm. The thickness of the high work function metal layer 1034 in the intermediate connector is in the range of from 0.1 nm to 5.0 nm. The thickness of the low work function metal layer 1335 in the intermediate connector is in the range of from 0.1 nm to 10 nm. And the thickness of the n-type inorganic semiconductor layer 1536 in the intermediate connector is in the range of from 0.5 nm to 20 nm.

The tandem white OLED device of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. In these device configurations, the top electrode is transparent to light.

When EL emission is viewed through anode 110, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque, or reflective. Example conductors for this application include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes can be patterned using well known photolithographic processes. Optionally, anodes can be polished prior to the deposition of other layers to reduce surface roughness so as to reduce electrical shorts or enhance reflectivity.

When light emission is viewed solely through the anode, the cathode 140 used in the present invention can be comprised of nearly any conductive material. Desirable materials have effective film-forming properties to ensure effective contact with the underlying organic layer, promote electron injection at low voltage, and have effective stability. Useful cathode materials often contain a low work-function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin inorganic EIL in contact with an organic layer (e.g., ETL), which is capped with a thicker layer of a conductive metal. The inorganic EIL preferably includes a low work-function metal or metal salt and, if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, JP 3,234,963, and EP 1 076 368. Cathode materials are typically deposited by thermal evaporation, electron beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

The white organic EL unit and the intermediate connectors can be produced by thermal evaporation, electron beam evaporation, ion sputtering technique, or spin coating. Preferably, a thermal evaporation method is used for the deposition of all the materials in the fabrication of the tandem white OLED device including the white organic EL unit, the intermediate connectors, and the electrode over the top white organic EL unit.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

EXAMPLES

The following examples are presented for a further understanding of the present invention. In the following examples, the thickness of the organic layers and the doping concentrations were controlled and measured in situ using calibrated thickness monitors (INFICON IC/5 Deposition Controller). The EL characteristics of all the fabricated devices were evaluated using a constant current source (KEITHLEY 2400 SourceMeter) and a photometer (PHOTO RESEARCH SpectraScan PR 650) at the room temperature. The color will be reported using 1931 CIE coordinates.

Example 1 (Comparative)

The preparation of a comparative white OLED device is as follows: A~1.1 mm thick glass substrate coated with a transparent indium-tin-oxide (ITO) conductive layer was cleaned and dried using a commercial glass scrubber tool. The thickness of ITO is about 42 nm and the sheet resistance of the ITO is about 68 $\Omega$/square. The ITO surface was subsequently treated with oxidative plasma to condition the surface as an anode. A layer of CFx, 1 nm thick, was deposited on the clean ITO surface as the hole-injecting layer by decomposing $CHF_3$ gas in an RF plasma treatment chamber. The substrate was then transferred into a vacuum deposition chamber for deposition of all other layers on top of the substrate. The following layers were deposited in the following sequence by evaporation from a heated boat under a vacuum of approximately $10^{-6}$ Torr:

1. EL unit:
    a) an HTL, about 90 nm thick, including "4,4'-bis[N-(1-naphthyl)-N-phenylamino]biphenyl" (NPB);
    b) a first LEL, 20 nm thick, including 70 vol. % NPB, 29.5 vol. % rubrene, and 0.5 vol. % "5,10,15,20-tetraphenyl-bisbenz[5,6]indeno[1,2,3-cd:1',2',3'-1 m]perylene" (red emitting layer);
    c) a second LEL, 40 nm thick, including 87 vol. % "2-(1,1-dimethyethyl)-9,10-di-2-naphthalenyl anthracene" (TBADN), 9 vol. % NPB, and 4 vol. % "4-(di-p-tolylamino)-4'-[(di-p-tolylamino)styryl]stil-bene" (blue emitting layer); and
    d) an ETL, 10 nm thick, including "tris(8-hydroxyquinoline)aluminum" (Alq).

2. Cathode: approximately 210 nm thick, including Mg:Ag (formed by co-evaporation of about 95 vol. % Mg and 5 vol. % Ag).

After the deposition of these layers, the device was transferred from the deposition chamber into a dry box (VAC Vacuum Atmosphere Company) for encapsulation.

Figure 17:
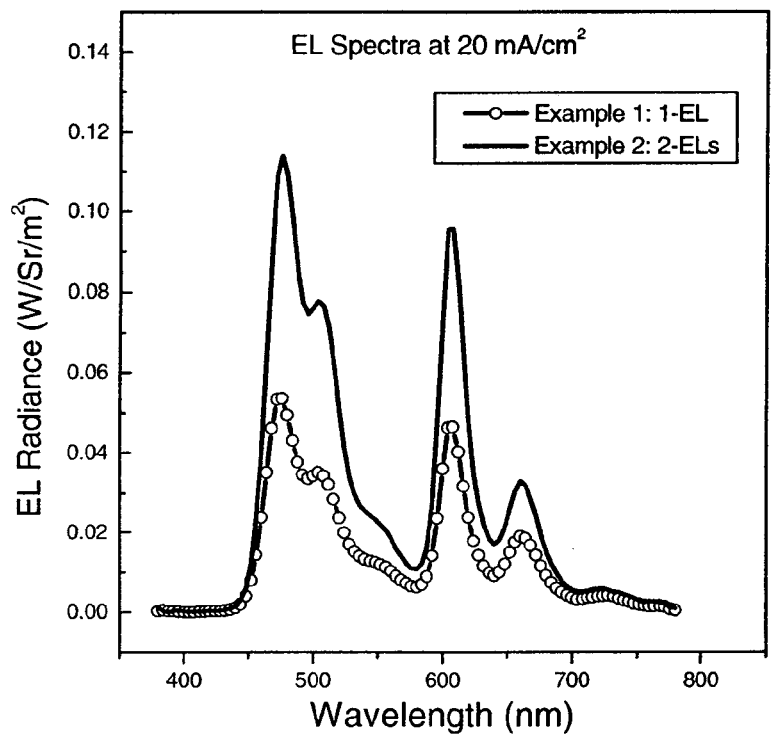
FIG. 17 is a graph of electroluminescence spectra of Examples 1 and 2.
Figure 18:
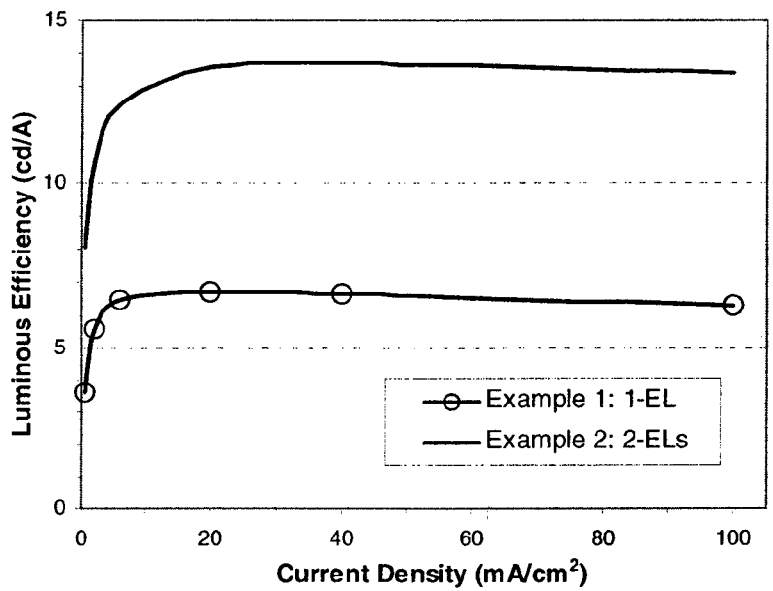
FIG. 18 is a graph of luminous efficiency vs. current density of Examples 1 and 2.

When tested at 20 mA/cm$^2$, this white OLED device has a luminance of 1345 cd/m$^2$ and a luminous efficiency of about 6.7 cd/A. The CIEx and CIEy are 0.330, 0.340, respectively. The EL spectrum is shown in FIG. 17 and the luminous efficiency characteristics are shown in FIG. 18.

Example 2

A tandem white OLED was constructed in the manner described in Example 1, and the deposited layer structure is:

1. 1$^{st}$ EL Unit:
   The 1$^{st}$ EL unit is the same as the EL unit in Example 1.

2. 1$^{st}$ Intermediate Connector:
   a) an n-type doped organic layer, 30 nm thick, including Alq doped with about 1.2 vol. % lithium; and
   b) a p-type doped organic layer, 30 nm thick, including NPB doped with about 4 vol. % "2,3,5,6-tetrafluoro-7,7,8,8-tetracyanoquinodimethane" (F$_4$-TCNQ).

3. 2$^{nd}$ EL Unit:
   The 2$^{nd}$ EL unit is the same as the EL unit in Example 1 except that the thickness of the NPB layer (HTL) is changed from 90 nm to 20 nm.

4. Cathode: approximately 210 nm thick, including Mg:Ag.

When tested at 20 mA/cm$^2$, this tandem white OLED device has a luminance of 2712 cd/m$^2$ and a luminous efficiency of about 13.6 cd/A. The CIEx and CIEy are 0.325, 0.344, respectively. The EL spectrum is shown in FIG. 17 and the luminous efficiency characteristics are shown in FIG. 18.

Example 2 clearly indicates that two white EL units connected by an intermediate connector having an n-type doped organic layer and a p-type doped organic layer can double the luminous efficiency while keeping the color basically unchanged. This tandem white OLED device has twice the brightness without increasing the drive current density compared to the conventional white OLED device (Example 1). Therefore, it can be expected to meet a high brightness requirement by adding more EL units in the structure. Since it requires less current density for the tandem white OLED device to maintain a specific brightness compared to the conventional white OLED device, the tandem white OLED device can have a longer lifetime.

Example 3 (Comparative)

Another conventional white OLED device was constructed in the manner described in Example 1, and the deposited layer structure is:

1. EL Unit:
   a) an HTL, about 30 nm thick, including NPB;
   b) a first LEL, 30 nm thick, including NPB doped with about 2 vol. % "2,8-di-tert-butyl-5,11-di(p-tert-butylphenyl)-6,12-di([1,1'-biphenyl]-4-yl)naphthacene" (yellow emitting layer);
   c) a second LEL, 40 nm thick, including 70 vol. % "9,10-di-2-naphthalenyl anthracene" (A-DN), 28 vol. % NPB, and about 2 vol. % "4-(di-p-tolylamino)-4'-[(di-p-tolylamino)styryl]stilbene" (blue emitting layer);
   d) an ETL, 10 nm thick, including "4,7-diphenyl-1,10-phenanthroline" (Bphen); and
   e) an electron-injecting layer, 10 nm thick, including Bphen doped with about 1.2 vol. % lithium.

2. Cathode: approximately 210 nm thick, including Mg:Ag.

Figure 19:
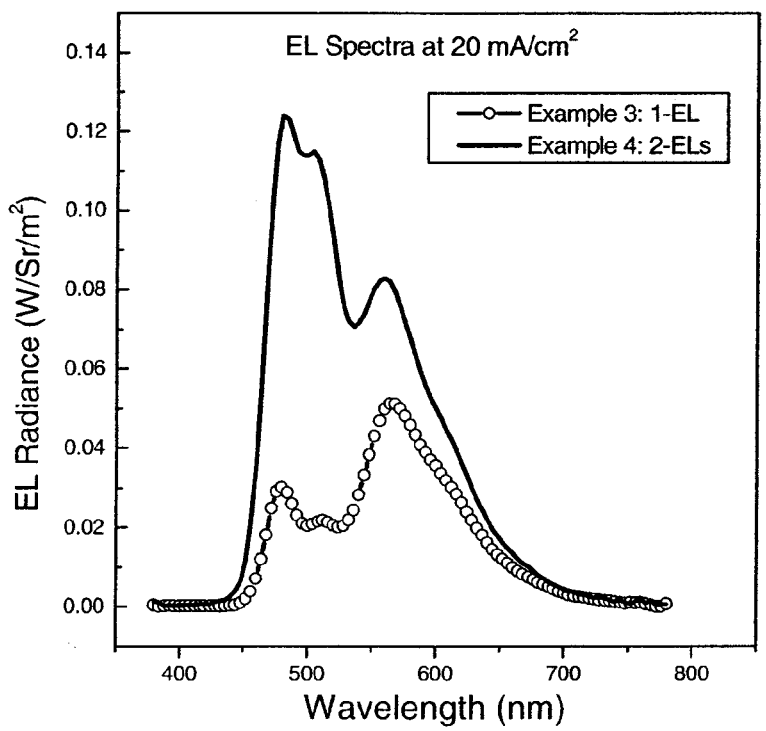
FIG. 19 is a graph of electroluminescence spectra of Examples 3 and 4.
Figure 20:
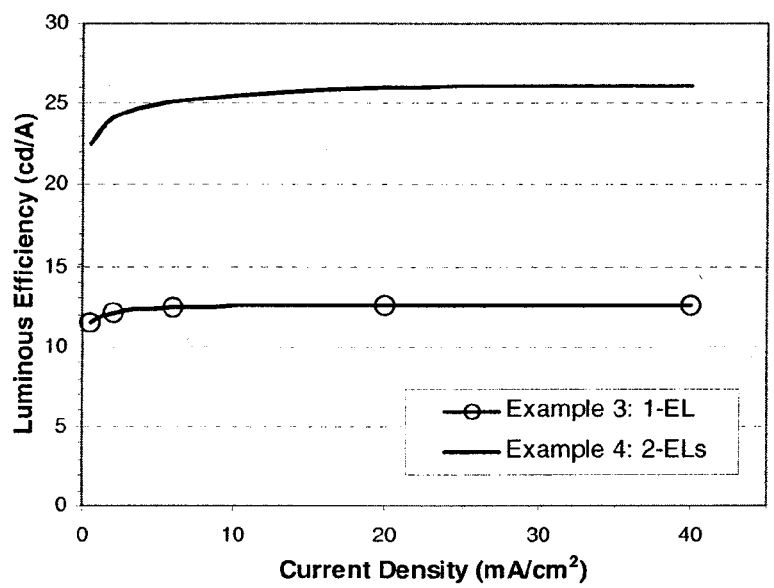
FIG. 20 is a graph of luminous efficiency vs. current density of Examples 3 and 4.

When tested at 20 mA/cm$^2$, this white OLED device has a luminance of 2497 cd/m$^2$ and a luminous efficiency of about 12.5 cd/A. The CIEx and CIEy are 0.427, 0.471, respectively. The EL spectrum is shown in FIG. 19 and the luminous efficiency characteristic are shown in FIG. 20.

Example 4

A tandem white OLED was constructed in the manner described in Example 1, and the deposited layer structure is:

1. 1$^{st}$ EL Unit:
   a) an HTL, about 30 nm thick, including NPB;
   b) a first LEL, 30 nm thick, including NPB doped with about 2 vol. % "2,8-di-tert-butyl-5,11-di(p-tert-butylphenyl)-6,12-di([1,1'-biphenyl]-4-yl)naphthacene" (yellow emitting layer);
   c) a second LEL, 40 nm thick, including 70 vol. % A-DN, 28 vol. % NPB, and about 2 vol. % "4-(di-p-tolylamino)-4'-[(di-p-tolylamino)styryl]stilbene" (blue emitting layer); and
   d) an ETL, 10 nm thick, including Bphen.

2. 1$^{st}$ Intermediate Connector:
   a) an n-type doped organic layer, 10 nm thick, including Bphen doped with about 1.2 vol. % lithium; and
   b) a metal compound layer, 2 nm thick, including WO$_3$.

3. 2$^{nd}$ EL Unit:
   a) an HTL, about 70 nm thick, including NPB;
   b) a first LEL, 30 nm thick, including NPB doped with about 2 vol. % "2,8-di-tert-butyl-5,11-di(p-tert-butylphenyl)-6,12-di([1,1'-biphenyl]-4-yl)naphthacene" (yellow emitting layer);
   c) a second ETL, 40 nm thick, including 70 vol. % A-DN, 28 vol. % NPB, and about 2 vol. % "4-(di-p-tolylamino)-4'-[(di-p-tolylamino)styryl]stilbene" (blue emitting layer);
   d) an ETL, 10 nm thick, including Bphen; and
   e) an electron-injecting layer, 10 nm thick, including Bphen doped with about 1.2 vol. % lithium.

4. Cathode: approximately 210 nm thick, including Mg:Ag.

When tested at 20 mA/cm$^2$, this tandem white OLED device has a luminance of 5189 cd/m$^2$ and a luminous efficiency of about 26.0 cd/A. The CIEx and CIEy are 0.305, 0.450, respectively. The EL spectrum is shown in FIG. 19 and the luminous efficiency characteristic are shown in FIG. 20.

Example 4 also indicates that two white EL units connected by an intermediate connector having an n-type doped organic layer and a metal compound layer can double the luminous efficiency and improve the color as well. Therefore, more white EL units can be connected using the intermediate connectors to achieve higher brightness or longer operational lifetime.

The invention has been described in detail with particular reference to certain preferred embodiments thereof, but it will be understood that variations and modifications can be effected within the spirit and scope of the invention.

PARTS LIST 100 tandem white OLED device (prior art)
110 anode
120.1 $1^{st}$ EL unit with blue emission (or $1^{st}$ EL unit—blue)
120.2 $2^{nd}$ EL unit with red emission (or $1^{st}$ EL unit—red)
130.1 charge-generating layer (CGL)
140 cathode
150 voltage/current source
160 electrical conductors
200 tandem white OLED device (prior art)
220.1 $1^{st}$ EL unit with blue emission (or $1^{st}$ EL unit—blue)
220.2 $2^{nd}$ EL unit with green emission (or $2^{nd}$ EL unit—green)
220.3 $3^{rd}$ EL unit with red emission (or $3^{rd}$ EL unit—red)
230.1 $1^{st}$ intermediate connector (or $1^{st}$ connector)
230.2 $2^{nd}$ intermediate connector (or $2^{nd}$ connector)
300 tandem white OLED device
320.1 $1^{st}$ EL unit with white emission (or $1^{st}$ EL unit—white)
320.2 $2^{nd}$ EL unit with white emission (or $2^{nd}$ EL unit—white)
320.(N−1) $(N-1)^{th}$ EL unit with white emission (or $(N-1)^{th}$ EL unit—white)
320.N $N^{th}$ EL unit with white emission (or $N^{th}$ EL unit—white)
330.1 $1^{st}$ intermediate connector (or $1^{st}$ connector)
330.2 $2^{nd}$ intermediate connector (or $2^{nd}$ connector)
330.(N−1) $(N-1)^{th}$ intermediate connector (or $(N-1)^{th}$ connector)
400 tandem white OLED device having two white EL units
520 EL unit having three light-emitting layers
521 hole-transporting layer
522.1 $1^{st}$ light-emitting layer
522.2 $2^{nd}$ light-emitting layer
522.3 $3^{rd}$ light-emitting layer
523 electron-transporting layer
620 EL unit having two light-emitting layers
720 EL unit having one light-emitting layer
830 intermediate connector
831 n-type doped organic layer
832 p-type doped organic layer
930 intermediate connector
933 metal compound layer
1030 intermediate connector
1034 high work function metal layer
1130 intermediate connector
1230 intermediate connector
1330 intermediate connector
1335 low work function metal layer
1430 intermediate connector
1530 intermediate connector
1536 n-type inorganic semiconductor layer (or n-type inorganic semiconductor)
1630 intermediate connector

The invention claimed is:

1. A tandem white OLED device comprising:
   a) an anode;
   b) a cathode;
   c) a plurality of organic electroluminescence units disposed between the anode and the cathode, wherein each organic electroluminescence unit includes at least one light-emitting layer, and wherein each organic electroluminescence unit emits white light; and
   d) an intermediate connector disposed between each adjacent organic electroluminescence unit, wherein the intermediate connector includes at least two different layers, and wherein the intermediate connector has no direct connection to an external power source.

2. The tandem white OLED device of claim 1 wherein each organic electroluminescence unit includes at least three light-emitting layers, and wherein each of the light-emitting layers has a different color of emission.

3. The tandem white OLED device of claim 1 wherein each organic electroluminescence unit includes at least two light-emitting layers, and wherein each of the light-emitting layers has a different color of emission.

4. The tandem white OLED device of claim 1 wherein each organic electroluminescence unit includes at least one light-emitting layer.

5. The tandem white OLED device of claim 1 wherein each of the organic electroluminescence units can have the same or different layer structures provided that each electroluminescence unit produces white light.

6. The tandem white OLED device of claim 1 wherein each intermediate connector includes at least an n-type doped organic layer disposed adjacent to the electron-transporting layer of the preceding organic electroluminescence unit and a p-type doped organic layer disposed over the n-type doped organic layer.

7. The tandem white OLED device of claim 6 wherein each intermediate connector includes a metal compound layer disposed between the n-type organic layer and the p-type organic layer.

8. The tandem white OLED device of claim 6 wherein each intermediate connector includes a high work function metal layer disposed between the n-type organic layer and the p-type organic layer.

9. The tandem white OLED device of claim 1 wherein each intermediate connector has a sheet resistance of higher than 100 kΩ per square including at least an n-type doped organic layer disposed adjacent to the electron-transporting layer of the preceding organic electroluminescence unit and a metal compound layer disposed over the n-type doped organic layer.

10. The tandem white OLED device of claim 9 wherein each intermediate connector includes a high work function metal layer disposed between the n-type organic layer and the metal compound layer.

11. The tandem white OLED device of claim 1 wherein each intermediate connector has a sheet resistance of higher than 100 kΩ per square including at least a low work function metal layer disposed adjacent to the electron-transporting layer of the preceding organic electroluminescence unit and a metal compound layer disposed over the low work function metal layer.

12. The tandem white OLED device of claim 11 wherein each intermediate connector includes a high work function metal layer disposed between the low work function metal layer and the metal compound layer.

13. The tandem white OLED device of claim 1 wherein each intermediate connector has a sheet resistance of higher than 100 kΩ per square including at least an n-type inorganic semiconductor layer disposed adjacent to the electron-transporting layer in the organic electroluminescence unit and a metal compound layer disposed over the n-type inorganic semiconductor layer.

14. The tandem white OLED device of claim 13 wherein each intermediate connector includes a high work function metal layer disposed between the n-type inorganic semiconductor layer and the metal compound layer.

15. The tandem white OLED device of claim 1 wherein each of the intermediate connectors can have the same or different layer structures.

16. The tandem white OLED device of claim 6 wherein the n-type doped organic layer contains at least one organic host material and at least one n-type dopant, wherein the organic host material is capable of supporting electron transport.

17. The tandem white OLED device of claim 16 wherein the organic host material includes metal chelated oxinoid compounds, butadiene derivatives, heterocyclic optical brighteners, triazines, hydroxyquinoline derivatives, benzazole derivatives, phenanthroline derivatives, or silole derivatives, or combinations thereof.

18. The tandem white OLED device of claim 16 wherein the organic host material includes tris(8-hydroxyquinoline) aluminum (Alq), 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

19. The tandem white OLED device of claim 16 wherein the n-type dopant includes alkali metals, alkali metal compounds, alkaline earth metals, or alkaline earth metal compounds, or combinations thereof.

20. The tandem white OLED device of claim 16 wherein the n-type dopant includes Li, Na, K, Rb, Cs, Mg, Ca, Sr, Ba, La, Ce, Nd, Sm, Eu, Tb, Dy, or Yb, or combinations thereof.

21. The tandem white OLED device of claim 6 wherein the p-type doped organic layer contains at least one organic host material and at least one p-type dopant, wherein the organic host material is capable of supporting hole transport.

22. The tandem white OLED device of claim 21 wherein the organic host material includes aromatic tertiary amines having at least one trivalent nitrogen atom that is bonded only to carbon atoms, at least one of which is a member of an aromatic ring.

23. The tandem white OLED device of claim 21 wherein the organic host material includes N,N'-di(naphthalene-1-yl)-N,N'-diphenyl-benzidine (NPB), N,N'-diphenyl-N,N'-bis(3-methylphenyl)-1,1-biphenyl-4,4'-diamine (TPD), N,N,N',N'-tetranaphthyl-benzidine (TNB), 4,4',4''-tris(N-3-metylphenyl-N-phenyl-amino)-triphenylamine (m-MTDATA), 4,4',4''-tris(N,N-diphenyl-amino)-triphenylamine (TDATA), or dihydrophenazine compounds, or combinations thereof.

24. The tandem white OLED device of claim 21 wherein the p-type dopant includes oxidizing agents capable of forming a charge transfer complex with the host material.

25. The tandem white OLED device of claim 21 wherein the p-type dopant includes iodine, $FeCl_3$, $FeF_3$, $SbCl_5$, 2,3,5,6-tetrafluoro-7,7,8,8-tetracyanoquinodimethane ($F_4$-TCNQ), or other derivatives of 7,7,8,8-tetra-cyanoquinodimethane (TCNQ), or combinations thereof.

26. The tandem white OLED device of claim 7 wherein the metal compound layer includes $MoO_3$, $NiMoO_4$, $CuMoO_4$, $WO_3$, ZnTe, $Al_4C_3$, $AlF_3$, $B_2S_3$, CuS, GaP, InP, or SnTe.

27. The tandem white OLED device of claim 8 wherein the high work function metal layer includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof.

28. The tandem white OLED device of claim 9 wherein the n-type doped organic layer contains at least one organic host material and at least one n-type dopant, wherein the organic host material is capable of supporting electron transport.

29. The tandem white OLED device of claim 28 wherein the organic host material includes metal chelated oxinoid compounds, 8-hydroxy-quinoline derivatives, butadiene derivatives, heterocyclic optical brighteners, triazines, benzazoles, phenanthroline derivatives, or silole derivatives, or combinations thereof.

30. The tandem white OLED device of claim 28 wherein the organic host material includes tris(8-hydroxyquinoline) aluminum (Alq), 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

31. The tandem white OLED device of claim 28 wherein the n-type dopant includes alkali metals, alkali metal compounds, alkaline earth metals, or alkaline earth metal compounds, or combinations thereof.

32. The tandem white OLED device of claim 28 wherein the n-type dopant includes Li, Na, K, Rb, Cs, Mg, Ca, Sr, Ba, La, Ce, Nd, Sm, Eu, Tb, Dy, or Yb, or combinations thereof.

33. The tandem white OLED device of claim 9 wherein the metal compound layer includes $MoO_3$, $NiMoO_4$, $CuMoO_4$, $WO_3$, ZnTe, $Al_4C_3$, $AlF_3$, $B_2S_3$, CuS, GaP, InP, or SnTe.

34. The tandem white OLED device of claim 10 wherein the high work function metal layer includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof.

35. The tandem white OLED device of claim 11 wherein the low work function layer includes Li, Na, K, Rb, Cs, Mg, Ca, Sr, Ba, La, Ce, Nd, Sm, Eu, Tb, Dy, or Yb, or combinations thereof.

36. The tandem white OLED device of claim 11 wherein the metal compound layer includes $MoO_3$, $NiMoO_4$, $CuMoO_4$, $WO_3$, ZnTe, $Al_4C_3$, $AlF_3$, $B_2S_3$, CuS, GaP, InP, or SnTe.

37. The tandem white OLED device of claim 12 wherein the high work function metal layer includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof.

38. The tandem white OLED device of claim 13 wherein the n-type inorganic semiconductor layer includes ZnSe, ZnS, ZnSSe, SnSe, SnS, SnSSe, $LaCuO_3$, or $La_4Ru_6O_{19}$.

39. The tandem white OLED device of claim 13 wherein the metal compound layer includes $MoO_3$, $NiMoO_4$, $CuMoO_4$, $WO_3$, ZnTe, $Al_4C_3$, $AlF_3$, $B_2S_3$, CuS, GaP, InP, or SnTe.

40. The tandem white OLED device of claim 14 wherein the high work function metal layer includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof.

41. The tandem white OLED device of claim 1 wherein the thickness of each light-emitting layer in the electroluminescence EL unit is in the range of from 5 nm to 50 nm.

42. The tandem white OLED device of claim 1 wherein the thickness of each layer in the intermediate connector is in the range of from 0.1 nm to 150 nm.

43. The tandem white OLED device of claim 7 wherein the thickness of the metal compound layer in the intermediate connector is in the range of from 0.5 nm to 20 nm.

44. The tandem white OLED device of claim 8 wherein the thickness of the high work function metal layer in the intermediate connector is in the range of from 0.1 nm to 5.0 nm.

45. The tandem white OLED device of claim 9 wherein the thickness of the metal compound layer in the intermediate connector is in the range of from 0.5 nm to 20 nm.

46. The tandem white OLED device of claim 10 wherein the thickness of the high work function metal layer in the intermediate connector is in the range of from 0.1 nm to 5.0 nm.

47. The tandem white OLED device of claim 11 wherein the thickness of the low work function metal layer in the intermediate connector is in the range of from 0.1 nm to 10 nm.

48. The tandem white OLED device of claim 11 wherein the thickness of the metal compound layer in the intermediate connector is in the range of from 0.5 nm to 20 nm.

49. The tandem white OLED device of claim 12 wherein the thickness of the high work function metal layer in the intermediate connector is in the range of from 0.1 nm to 5.0 nm.

50. The tandem white OLED device of claim 13 wherein the thickness of the n-type inorganic semiconductor layer in the intermediate connector is in the range of from 0.5 nm to 20 nm.

51. The tandem white OLED device of claim 13 wherein the thickness of the metal compound layer in the intermediate connector is in the range of from 0.5 nm to 20 nm.

52. The tandem white OLED device of claim 14 wherein the thickness of the high work function metal layer in the intermediate connector is in the range of from 0.1 nm to 5.0 nm.

53. The tandem white OLED device of claim 1 wherein the intermediate connector has at least 75% optical transmission in the visible region of the spectrum.

54. The tandem white OLED device of claim 1 wherein the intermediate connector is produced by thermal evaporation, electron beam evaporation, ion sputtering technique, or spin coating.

55. A tandem white OLED device comprising:
a) an anode;
b) a cathode;
c) a plurality of organic electroluminescence units disposed between the anode and the cathode, wherein each organic electroluminescence unit includes at least one light-emitting layer, and wherein each organic electroluminescence unit emits white light; and
d) an intermediate connector disposed between each adjacent organic electroluminescence unit, wherein the intermediate connector contains two different organic layers, and wherein the intermediate connector has no direct connection to an external power source.

56. The tandem white OLED device of claim 55 wherein each organic electroluminescence unit includes at least three light-emitting layers, and wherein each of the light-emitting layers has a different color of emission.

57. The tandem white OLED device of claim 55 wherein each organic electroluminescence unit includes at least two light-emitting layers, and wherein each of the light-emitting layers has a different color of emission.

58. The tandem white OLED device of claim 55 wherein each organic electroluminescence unit includes at least one light-emitting layer.

59. The tandem white OLED device of claim 55 wherein each of the organic electroluminescence units can have the same or different layer structures provided that each electroluminescence unit produces white light.

60. The tandem white OLED device of claim 55 wherein each intermediate connector includes at least an n-type doped organic layer disposed adjacent to the electron-transporting layer of the preceding organic electro-luminescence unit and a p-type doped organic layer disposed over the n-type doped organic layer.

61. The tandem white OLED device of claim 60 wherein each intermediate connector includes a metal compound layer disposed between an n-type doped organic layer and a p-type doped organic layer.

62. The tandem white OLED device of claim 60 wherein each intermediate connector includes a high work function metal layer disposed between an n-type doped organic layer and a p-type doped organic layer.

63. The tandem white OLED device of claim 55 wherein each of the intermediate connectors can have the same or different layer structures.

64. The tandem white OLED device of claim 60 wherein the n-type doped organic layer contains at least one organic host material and at least one n-type dopant, wherein the organic host material is capable of supporting electron transport.

65. The tandem white OLED device of claim 64 wherein the organic host material includes metal chelated oxinoid compounds, butadiene derivatives, heterocyclic optical brighteners, triazines, hydroxyquinoline derivatives, benzazole derivatives, phenanthroline derivatives, or silole derivatives, or combinations thereof.

66. The tandem white OLED device of claim 64 wherein the organic host material includes tris(8-hydroxyquinoline) aluminum (Alq), 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

67. The tandem white OLED device of claim 64 wherein the n-type dopant includes alkali metals, alkali metal compounds, alkaline earth metals, or alkaline earth metal compounds, or combinations thereof.

68. The tandem white OLED device of claim 64 wherein the n-type dopant includes Li, Na, K, Rb, Cs, Mg, Ca, Sr, Ba, La, Ce, Nd, Sm, Eu, Tb, Dy, or Yb, or combinations thereof.

69. The tandem white OLED device of claim 60 wherein the p-type doped organic layer contains at least one organic host material and at least one p-type dopant, wherein the organic host material is capable of supporting hole transport.

70. The tandem white OLED device of claim 69 wherein the organic host material includes aromatic tertiary amines having at least one trivalent nitrogen atom that is bonded only to carbon atoms, at least one of which is a member of an aromatic ring.

71. The tandem white OLED device of claim 69 wherein the organic host material includes N,N'-di(naphthalene-1-yl)-N,N'-diphenyl-benzidine (NPB), N,N'-diphenyl-N,N'-bis(3-methylphenyl)-1,1-biphenyl-4,4'-diamine (TPD), N,N,N',N'-tetranaphthyl-benzidine (TNB), 4,4',4"-tris(N-3-metylphenyl-N-phenyl-amino)-triphenylamine (m-MTDATA), 4,4',4"-tris(N,N-diphenyl-amino)-triphenylamine (TDATA), or dihydrophenazine compounds, or combinations thereof.

72. The tandem white OLED device of claim 69 wherein the p-type dopant includes oxidizing agents capable of forming a charge transfer complex with the host material.

73. The tandem white OLED device of claim 69 wherein the p-type dopant includes iodine, $FeCl_3$, $FeF_3$, $SbCl_5$, 2,3,5,6-tetrafluoro-7,7,8,8-tetracyanoquinodimethane ($F_4$-TCNQ), or other derivatives of 7,7,8,8-tetracyanoquinodimethane (TCNQ), or combinations thereof.

74. The tandem white OLED device of claim 61 wherein the metal compound layer includes $MoO_3$, $NiMoO_4$, $CuMoO_4$, $WO_3$, ZnTe, $Al_4C_3$, $AlF_3$, $B_2S_3$, CuS, GaP, InP, or SnTe.

75. The tandem white OLED device of claim 62 wherein the high work function metal layer includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof.

76. The tandem white OLED device of claim 55 wherein the thickness of each light-emitting layer in the electroluminescence EL unit is in the range of from 5 nm to 50 nm.

77. The tandem white OLED device of claim 55 wherein the thickness of each layer in the intermediate connector is in the range of from 0.1 nm to 150 nm.

78. The tandem white OLED device of claim 61 wherein the thickness of the metal compound layer in the intermediate connector is in the range of from 0.5 nm to 20 nm.

79. The tandem white OLED device of claim 62 wherein the thickness of the high work function metal layer in the intermediate connector is in the range of from 0.1 nm to 5.0 nm.

80. The tandem white OLED device of claim 55 wherein the intermediate connector has at least 75% optical transmission in the visible region of the spectrum.

81. The tandem white OLED device of claim 55 wherein the intermediate connector is produced by thermal evaporation, electron beam evaporation, ion sputtering technique, or spin coating.

* * * * *